United States Patent [19]

Miyashita

[11] Patent Number: 5,535,249
[45] Date of Patent: Jul. 9, 1996

[54] PRECISE DETECTION OF FREQUENCY ERROR FOR BURSTS MODULATED BY PREDETERMINED SYMBOL SEQUENCE

[75] Inventor: Toshikazu Miyashita, Tokyo, Japan

[73] Assignee: NEC Corporation, Tokyo, Japan

[21] Appl. No.: 498,750

[22] Filed: Jul. 6, 1995

[30] Foreign Application Priority Data

Jul. 6, 1994 [JP] Japan .................................... 6-154579

[51] Int. Cl.$^6$ ................................................ H04L 27/06
[52] U.S. Cl. .......................... 375/344; 375/226; 329/302; 329/306; 329/318
[58] Field of Search ................................ 455/226.1, 67.6; 371/48, 57.1, 64, 47.1; 375/344, 371, 326, 327, 226; 329/302, 306, 307, 318, 320, 300, 303, 304, 310

[56] References Cited

U.S. PATENT DOCUMENTS

| 5,396,521 | 3/1995 | Minami | 375/344 |
| 5,452,320 | 9/1995 | Kim et al. | 375/224 |
| 5,473,637 | 12/1995 | Gardner | 375/329 |

FOREIGN PATENT DOCUMENTS 3-23742  1/1991  Japan .

*Primary Examiner*—Stephen Chin
*Assistant Examiner*—Huong Luu
*Attorney, Agent, or Firm*—Sughrue, Mion, Zinn, Macpeak & Seas

[57] ABSTRACT

In detection of a frequency error of a local frequency for quadrature demodulation of a received signal by sampling (S2) each burst of the received signal by a sampling signal at a sampling period into a predetermined number $2m$ of sampled vectors, zeroth to $(2m-2)$-th phase errors are calculated (S3), each phase error accompanying a phase difference which is between two adjacent ones of the sampled vectors and is constant during each burst. Zeroth to $(m-1)$-th averages are calculated (S4(1)) as regards $m$ consecutive ones of the phase errors with each average calculated starting at a $q$-th phase error of the phase errors and with $q$ varied between zero and $(m-1)$, both inclusive. A mean value of these $m$ averages is calculated (S4(2)) and is divided (S5) by a divisor comprising the sampling period. The frequency error is given by a quotient of this division. The received signal is derived by reception of a transmitted signal subjected to digital angle modulation, such as GMSK or MSK modulation.

18 Claims, 3 Drawing Sheets

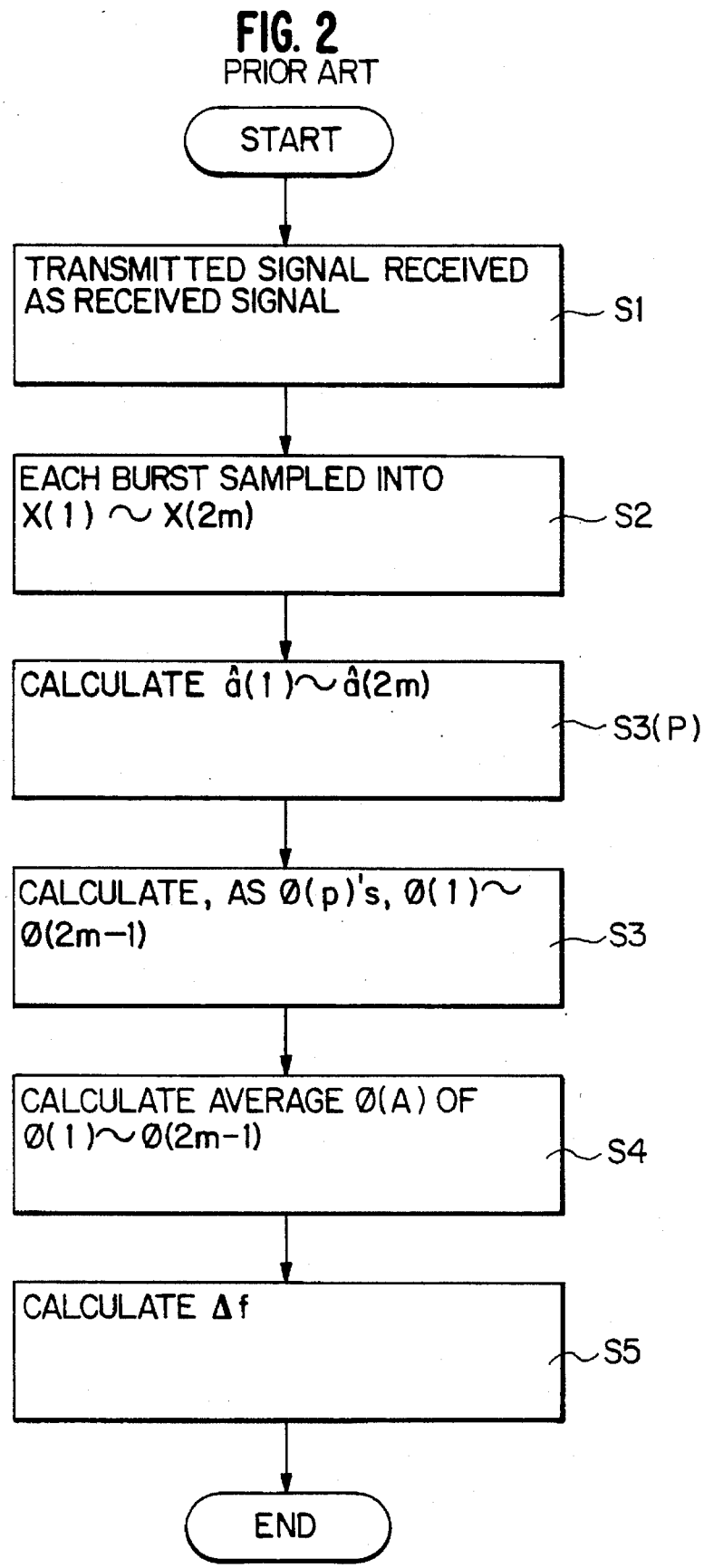

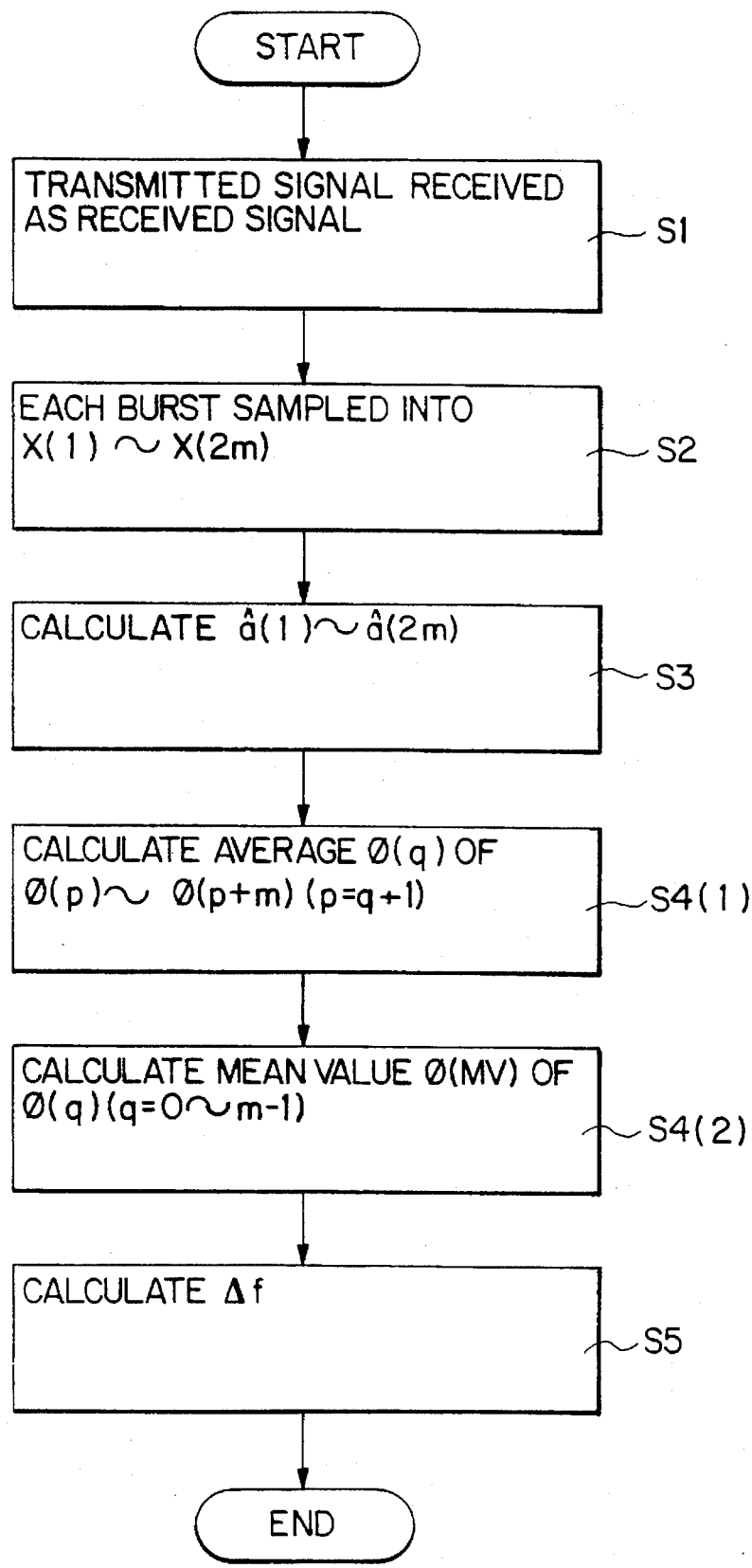

5,535,249

PRECISE DETECTION OF FREQUENCY ERROR FOR BURSTS MODULATED BY PREDETERMINED SYMBOL SEQUENCE

BACKGROUND OF THE INVENTION

This invention relates to frequency error detection of detecting, in quadrature demodulation of a received signal derived by reception of a transmitted signal subjected to digital angle modulation of a transmission carrier by a symbol sequence to have a constant phase difference during each symbol period, a frequency error which a locally generated frequency has relative to a reception frequency of a reception carrier carrying the received signal. Such quadrature demodulation is known in the art as described, for example, in Japanese Patent Prepublication (A) No. 23,742 of 1991.

Portable telephone and like mobile communication systems are recently in wide use. In a radio communication network like the mobile communication system, communication between a transmitter station and mobile stations is bidirectionally carried out by transmitting from the transmitter station a transmitted signal on a transmission carrier of a predetermined carrier frequency.

For transmission of the transmitted signal to the mobile stations, the transmission carrier is digital angle modulated by a predetermined symbol sequence of a symbol rate to provide a preamble in the transmitted signal. Each mobile station receives the transmitted signal as a received signal with the transmission carrier received as a reception carrier for quadrature demodulation of the received signal. For use in the quadrature demodulation, each mobile station comprises a local oscillator for generating a local signal of a local frequency related to the predetermined carrier frequency.

The transmission carrier has a transmission frequency which may be subjected to a slight shift from the predetermined carrier frequency. The reception carrier therefore has a reception frequency which may be a little different from the predetermined carrier frequency. Furthermore, the local frequency is liable to fluctuations from the predetermined carrier frequency.

The frequency error must consequently be detected for the quadrature demodulation. It is possible on detecting the frequency error to use the fact that the transmitted signal has a constant phase difference in each symbol period while the transmission carrier is modulated by the predetermined symbol sequence and that the received signal has the constant phase difference meanwhile. Incidentally, the digital angle modulation may be GMSK (Gaussian filter minimum shift keying) modulation, MSK (minimum (phase) shift keying) modulation, or like modulation.

In the manner which will later be described in greater detail, a conventional frequency error detecting method comprises the steps of: (a) sampling the received signal by a sampling signal of a sampling period into a predetermined number of sampled vectors in each burst, (b) calculating phase errors, each phase error accompanying a phase difference between two adjacent ones of the sampled vectors, (c) calculating an average of the phase errors as a dividend, and (d) dividing the dividend by a divisor comprising the sampling period. It is possible to understand the predetermined number as 2m without loss of generality and to refer to the phase errors as zeroth through (2m−2)-th phase errors.

The average theoretically depends only on a total phase error accompanying a total phase difference between the first and the 2m-th sampled vectors with no regard to the second through the (2m−1)-th sampled vectors. Each sampled vector may, however, be influenced by a noise component. If the first or the 2m-th sampled vector is influenced by an appreciable noise component, the frequency error is influenced by the noise components and has a detection precision liable to fluctuations resulting from the noise components accompanying the received signal.

SUMMARY OF THE INVENTION

It is consequently an object of the present invention to provide a frequency error detecting method of detecting, in quadrature demodulation of a received signal derived from a transmitted signal digital angle modulated by a symbol sequence to have a constant phase difference in each symbol period, a frequency error which a locally generated frequency has relative to a reception frequency of the received signal and which is precise and accurate.

It is another object of this invention to provide a frequency error detecting method which is of the type described and by which the frequency error is detected with a high detection precision even if the received signal is accompanied by noise.

It is still another object of this invention to provide a frequency error detecting method which is of the type described and which achieves the high detection precision even if a noise component accompanies each vector sampled from the received signal after the received signal is quadrature demodulated.

It is a different object of this invention to provide a frequency error detecting device for carrying out a frequency error detecting method of the type described.

It is a further different object of this invention to provide a quadrature demodulating device in which carried out is a frequency error detecting method of the type described.

Other objects of this invention will become clear as the description proceeds.

In accordance with an aspect of this invention, there is provided a frequency error detecting method of detecting, in quadrature demodulation of a received signal derived from a transmitted signal subjected to digital angle modulation by a symbol sequence to have a constant phase difference in each symbol period, a frequency error of a locally generated frequency relative to a reception frequency of the received signal, which frequency error detecting method comprises the steps of: (a) sampling the received signal by a sampling signal at a sampling period into sampled vectors 2m in number in each burst, where m represents a predetermined integer; (b) calculating zeroth through (2m−2)-th phase errors, each phase error accompanying a phase difference between two adjacent ones of the sampled vectors; (c) calculating a dividend by using the zeroth through the (2m−2)-th phase errors; and (d) dividing the dividend by a divisor comprising the sampling period, wherein the dividend calculating step comprises the steps of: (A) calculating zeroth through (m−1)-th averages, each average as regards m consecutive ones of the zeroth through the (2m−2)-th phase errors starting at a q-th phase error of the zeroth through the (2m−2)-th phase errors with q varied between zero and (m−1), both inclusive; and (B) calculating as the dividend a mean value of the zeroth through the (m−1)-th averages.

In accordance with a different aspect of this invention, there is provided a frequency error detecting device which is for detecting, in quadrature demodulation of a received signal derived from a transmitted signal subjected to digital angle modulation by a symbol sequence to have a constant phase difference in each symbol period, a frequency error of a locally generated frequency relative to a reception frequency of the received signal and which comprises: (a) means for sampling the received signal by a sampling at a sampling period into sampled vectors 2m in number in each burst, where m represents a predetermined integer; (b) means for calculating zeroth through (2m−2)-th phase errors, each phase error accompanying a phase difference between two adjacent ones of the sampled vectors; (c) means for calculating a dividend by using the zeroth through the (2m−2)-th phase errors; and (d) means for dividing the dividend by a divisor comprising the sampling period, wherein the dividend calculating means comprises: (A) means for calculating zeroth through (m−1)-th averages, each average as regards m consecutive ones of the zeroth through the (2m−2)-th phase errors starting at a q-th phase error of the zeroth through the (2m−2)-th phase errors with q varied between zero and (m−1), both inclusive; and (B) means for calculating as the dividend a mean value of the zeroth through the (m−1)-th averages.

In accordance with a further different aspect of this invention, there is provided a quadrature demodulating device which is for demodulating a received signal derived from a transmitted signal subjected to digital angle modulation by a symbol sequence to have a constant phase difference in each symbol period and in which a frequency error of a locally generated frequency relative to a reception frequency of the received signal is detected by a frequency error detecting arrangement comprising: (a) means for sampling the received signal by a sampling signal at a sampling period into sampled vectors 2m in number in each burst, where m represents a predetermined integer; (b) means for calculating zeroth through (2m−2)-th phase errors, each phase error accompanying a phase difference between two adjacent ones of the sampled vectors; means for calculating a dividend by using the zeroth through the (2m−2)-th phase errors; and (d) means for dividing the dividend by a divisor comprising the sampling period, wherein the dividend calculating means comprises: (A) means for calculating zeroth through (m−1)-th averages, each average as regards m consecutive ones of the zeroth through the (2m−2)-th phase errors starting at a q-th phase error of the zeroth through the (2m−2)-th phase errors with q varied between zero and (m−1), both inclusive; and (B) means for calculating as the dividend a mean value of the zeroth through the (m−1)-th averages.

BRIEF DESCRIPTION OF THE DRAWINGS

FIG. 2 shows a flow chart for use in describing a conventional frequency error detecting method;

FIG. 4 shows a flow chart for use in describing a frequency error detecting method according to an embodiment of this invention.

DESCRIPTION OF THE PREFERRED EMBODIMENT

Figure 1:
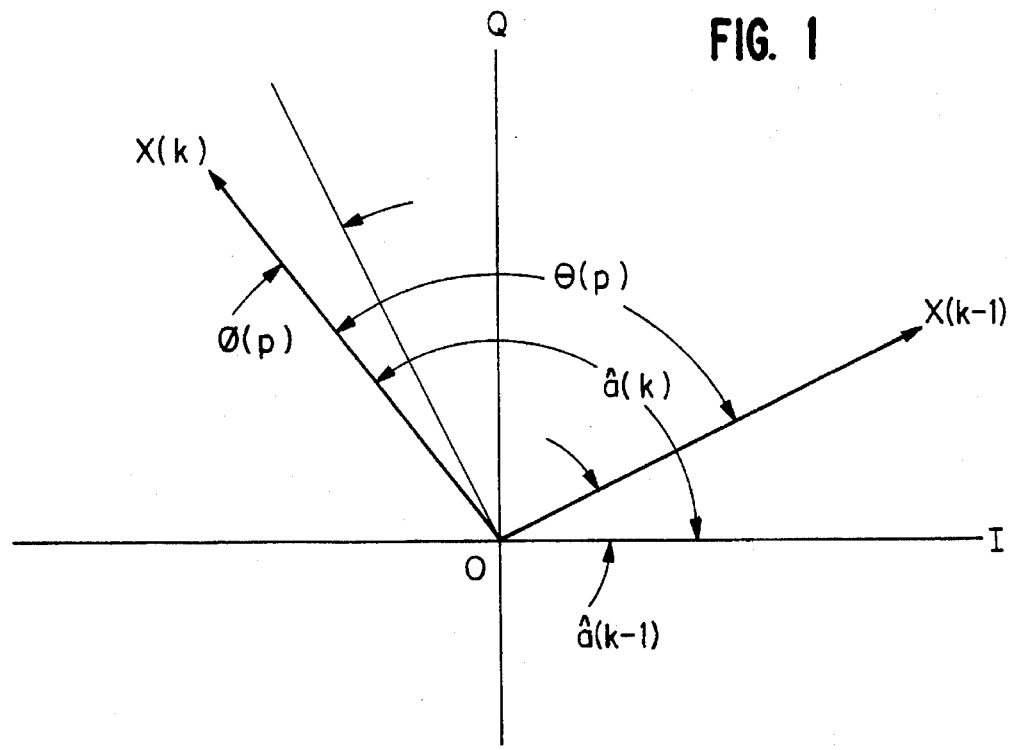
FIG. 1 shows sampled vectors sampled from a received signal used in a quadrature demodulator to which the instant invention is applicable.

Referring to FIG. 1, a frequency error detecting method will be described in general. The frequency error detecting method is used in quadrature demodulation of a received signal derived by reception of a transmitted signal subjected to digital angle modulation of a transmission carrier by a symbol sequence of a predetermined symbol rate to have a constant phase difference during each symbol period. In the transmitted signal, the symbol sequence provides, for example, a preamble. For use in the quadrature demodulation, a local signal is generated with a locally generated frequency. The locally generated frequency has a frequency error $\Delta f$ relative to a reception frequency of a reception carrier carrying the received signal.

In the quadrature demodulation, each burst of the received signal is sampled by a sampling signal at a sampling period T into first through K-th sampled vectors, where K represents a predetermined number which is typically equal to 128 and can be denoted by 2m without loss of generality. It should be noted in the following that k represents an integer variable between 1 and K or 2m. both inclusive, and that (k−1) of zero is taken out of consideration.

In FIG. 1, k-th and (k−1)-th sampled vectors X(k) and X(k−1) are illustrated. The k-th sampled vector has a k-th inphase or I component I(k) and a k-th quadrature or Q component Q(k). The k-th and the (k−1)-th sampled vectors are depicted on a phase plane defined by I and Q axes which intersect each other at an origin O (oh) and are understood as being orthogonal merely for simplicity of the description.

On the phase plane, the k-th sampled vector has a k-th phase angle or argument â(k). The (k−1)-th sampled vector has a (k−1)-th phase angle â(k−1). Although depicted as being given by an absolute value, such a phase angle is measured with a plus or a minus sign counterclockwise from the I axis. The k-th and the (k−1)-th sampled vectors have a p-th phase difference θ(p), where p is equal to (k−1) and is variable between 1 and (K−1), both inclusive.

When the digital angle modulation of the transmission carrier is the GMSK modulation mentioned hereinabove, such a phase difference is always equal to 90° of angle in the transmitted signal during each symbol period. This phase difference of a constant phase difference is kept in the sampled vectors during each burst if the locally generated frequency is exactly equal to the reception frequency. The phase difference between the k-th and the (k−1)-th sampled vectors may, however, be accompanied by a p-th phase error ø(p) which is not necessarily equal to zero and is exaggeratedly indicated in FIG. 1.

Turning to FIG. 2 with FIG. 1 continuously referred to, a conventional frequency error detecting method will be described in order to facilitate an understanding of the present invention. This conventional frequency error detecting method is for detecting the frequency error described in the foregoing with the GMSK modulation used.

The transmitted signal is received as the received signal at a first step S1. Each burst of the received signal is sampled into the first through the K-th sampled vectors X(b 1) to X(K) or X(2m) at a second step S2. Although herein unnecessary in practice, it will be presumed merely for convenience of the description which follows that the first through the K-th phase angles â(1) to â(2m) are calculated at a third preliminary step S3(P). At a practical third step S3, calculated are the first through the (K−1)-th phase errors ø(1) to ø(2m−1), each phase error ø(p) accompanying the p-th phase difference between the k-th and the (k−1)-th sampled vectors.

Attention will be directed to the practical third step S3. It is readily understood in FIG. 1 that the k-th phase angle is given by:

$$â(k)=\arctan(Q(k)/I(k)). \tag{1}$$

The p-th phase difference is given by:

$$\cos\theta(p)=(I(k)Q(k-1)-I(k-1)Q(k))/(|X(k-1)||X(k)|). \quad (2)$$

In the GMSK modulation where the constant phase difference of 90° is kept in the p-th phase differences during each burst, the p-th phase error is given by:

$$\phi(p)=\theta(p)-90°$$

Each phase error is sufficiently less than one radian. Equation (2) therefore becomes:

$$\cos\theta(p)\approx\phi(p).$$

When the GMSK modulation is used, the sampled vectors have a substantially common magnitude or absolute value in the received signal. Therefore:

$$\phi(p)=(I(k)Q(k-1)-I(k-1)Q(k))/(I^2(k)+Q^2(k)).$$

At a fourth step S4, an average $\phi(A)$ of the first through the (K−1)-th phase errors is calculated as follows:

$$\phi(A) = (1/K-1) \sum_{p=1}^{K-1} \phi(p).$$

Dividing at a fifth step S5 the average of the phase errors by a divisor comprising the sampling period, the frequency error is calculated by:

$$\Delta f=\phi(A)/(2\pi T).$$

Attention will now be directed to the fourth step S4. Calculation of the average is equivalent to:

$$\phi(A)=(1/(K-1))(\hat{a}(K)-\hat{a}(1))-90°. \quad (3)$$

The k-th sampled vector may be accompanied by a k-th noise component a'(k) accompanying the k-th phase angle. In this event, the average becomes:

$$\phi(A)=(1/(K-1))(\hat{a}(K)-\hat{a}(1))-90°+(1/(K-1))(a'(K)-a'(1)),$$

where the third term on the right-hand side represents an additional phase error resulting from the first through the K-th noise components. In FIG. 1, the angle of 90° from the (k−1)-th sampled vector is depicted by a thin straight line ending at the origin O of the phase plane. It is now understood that the frequency error is influenced by the noise components accompanying the first through the K-th sampled vectors.

Figure 3:
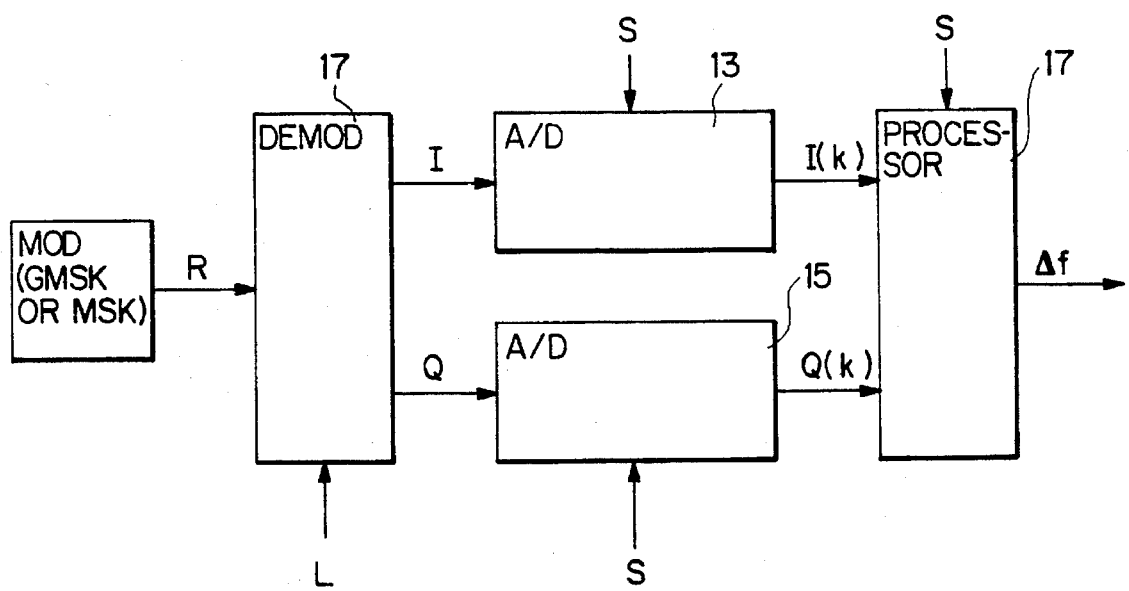
FIG. 3 is a block diagram of a quadrature demodulator device to which this invention is applicable.

Referring to FIG. 3 with FIG. 1 continuously referred to, a quadrature demodulator device is for quadrature demodulating the received signal indicated at R. Inphase and quadrature components of the local signal are collectively indicated at L and will be called the local signal. The sampling signal is indicated at S.

By using the inphase and the quadrature components of the local signal, a quadrature demodulator (DEMOD) 11 demodulates the received signal into inphase and quadrature signal components I and Q (the same reference symbols as the I and the Q axes being used). Supplied with the sampling signal of the sampling period which is equal to the symbol rate described before, inphase and quadrature A/D converters 13 and 15 convert the inphase and the quadrature signal components into digital samples which are the inphase and the quadrature components I(k) and Q(k) described in the foregoing.

Supplied with the inphase and the quadrature components and the sampling signal, a digital signal processor 17 produces a processor output signal indicative of the frequency error $\Delta f$ from time to time. When the conventional frequency error detecting method is used, the processor 17 carries out the steps illustrated with reference to FIG. 2. It is possible to use the quadrature demodulator device in dealing with the received signal as follows in accordance with this invention. In either event, it is readily possible to implement the processor 17 by a microprocessor. It is additionally possible to use the microprocessor in dealing with the received signal for reception, such as collation of an identification number indicative of a mobile station comprising the quadrature demodulator device being illustrated.

Referring afresh to FIG. 4 and again to FIG. 1, the description will proceed to a frequency error detecting method according to a preferred embodiment of this invention. Steps similar to those described in connection with the conventional frequency error detecting method will be designated by like reference symbols. The number of sampled vectors in each burst will now be denoted solely by 2m. That is, k is variable between 1 and 2m, both inclusive. Here, (2m−1) is always taken into account because (2m−1) represents an odd integer.

Like in the conventional frequency error detecting method, the transmitted signal is received as the received signal at a first step S1. Each burst of the received signal is sampled into the first through the 2m-th sampled vectors X(1) to X(2m) at a second step S2. The first through the 2m-th phase angles $\hat{a}(1)$ to $\hat{a}(2m)$ are calculated by using Equation (1) in a subsequent step which is called the third preliminary step in FIG. 2 and will now be referred to simply as a third step S3.

At a fourth quaternary step S4(1), a q-th average $\bar{\phi}(q)$ of m consecutive phase errors is calculated with the (p−1)-th phase error used as a q-th phase error, starting at the q-th phase error, where q is variable between zero and (m−1), both inclusive. This q-th average will herein be designated simply by $\phi(q)$. In this manner, the first through the 2m-th phase angles are used in calculating such averages $\phi(0)$ through $\phi(m-1)$ in the example being illustrated. At a second quaternary step S4(2), an arithmetic mean value $\phi(MV)$ of the zeroth through the (m−1)-th averages is calculated for use as a dividend in place of the average $\phi(A)$ described in conjunction with FIG. 2. The first and the second quaternary steps will collectively be referred to as a fourth step S4, at which the dividend is calculated by using the zeroth through the (2m−2)-th phase errors. Subsequently, the dividend is divided at a fifth step S5 by the divisor comprising the sampling period to get the frequency error $\Delta f$.

In this fourth step, it will again be assumed that the q-th phase error is accompanied by a q-th noise component a'(q). The q-th average is calculated by:

$$\phi(q)=(1/m)(\hat{a}(q+m+1)-\hat{a}(q+1))-90° +(1/m)(a'(q+m+1)-a'(q+1)).$$

It should be noted that the arithmetic mean value is calculated with the zeroth through the (2m−2)-th phase errors used in calculating the m averages in total with the q-th through the (q+m)-th phase errors shifted one by one from q of zero up to q of (m−1). It is therefore qualitatively clear that the arithmetic mean value is less influenced by the noise components accompanying the first through the 2m-th sampled vectors than the average used in the conventional frequency error detecting method.

Influence of such noise components will now quantitatively be considered. Accompanying the q-th average, a q-th additional phase error for the m consecutive phase errors will be denoted by E(q). Such an additional phase error is given by:

$$E(q)=(1/m^2)(a'(q+m+1)-a'(q+1)).$$

When the first through the 2m-th noise components have a divergence σ the q-th additional phase error is given by:

$$E(q)=2 \sigma/m^{3/2}. \quad (4)$$

In the conventional frequency error detecting method, the third term on the right-hand side of Equation (3) is approximately equal to:

$$\sigma/(2m-1). \quad (5)$$

Comparing Equation (4) with Formula (5), it is appreciated that the additional phase error is smaller in the example of this invention than in the conventional frequency error detecting method if the predetermined number 2m is equal to or greater than 30 (i.e., if m is not less than 15). The frequency error is accordingly less in the example being illustrated than that determined by the conventional frequency error detecting method.

FIGS. 2 and 4 will be reviewed. In the third preliminary step S3(p) of FIG. 2, the first through the 2m-th phase angles â(1) to â(2m) are calculated. This step is not used in practice in FIG. 2 with the practical third step S3 used instead and is mentioned in connection with FIG. 4 afresh as the third step S3. It is consequently possible to understand in FIGS. 2 and 4 that the first through the (2m−1)-th phase errors or the zeroth through the (2m−2)-th phase errors are calculated in the third step S3.

While this invention has thus far been described in specific conjunction with a sole preferred embodiment thereof, it will now be readily possible for one skilled in the art to put this invention in various other manners into practice. For example, it is possible to calculate the dividend in the second quaternary step S4(2) by calculating similar mean value or median of the zeroth through the (m−1)-th averages. The constant phase difference is kept in each burst when the digital angle modulation is the MSK modulation or any other like modulation.

What is claimed is:

1. A frequency error detecting method of detecting, in quadrature demodulation of a received signal derived from a transmitted signal subjected to digital angle modulation by a symbol sequence to have a constant phase difference in each symbol period, a frequency error of a locally generated frequency relative to a reception frequency of said received signal, said frequency error detecting method comprising the steps of sampling said received signal by a sampling signal at a sampling period into sampled vectors 2m in number, where m represents a predetermined integer, calculating zeroth through (2m−2)-th phase errors, each phase error accompanying a phase difference between two adjacent ones of said sampled vectors, calculating a dividend by using said zeroth through said (2m−2)-th phase errors, and dividing said dividend by a divisor comprising said sampling period, wherein said dividend calculating step comprises the steps of:

calculating zeroth through (m−1)-th averages, each average as regards m consecutive ones of said zeroth through said (2m−2)-th phase errors starting at a q-th phase error of said zeroth through said (2m−2)-th phase errors with q varied between zero and (m−1), both inclusive; and calculating as said dividend a mean value of said zeroth through said (m−1)-th averages.

2. A frequency error detecting method as claimed in claim 1, wherein said predetermined integer is not less than fifteen.

3. A frequency error detecting method as claimed in claim 1, wherein said digital angle modulation is Gaussian filter minimum shift keying modulation.

4. A frequency error detecting method as claimed in claim 3, wherein said predetermined integer is not less than fifteen.

5. A frequency error detecting method as claimed in claim 1, wherein said digital angle modulation is minimum phase shift keying.

6. A frequency error detecting method as claimed in claim 5, wherein said predetermined integer is not less than fifteen.

7. A frequency error detecting device for detecting, in quadrature demodulation of a received signal derived from a transmitted signal subjected to digital angle modulation by a symbol sequence to have a constant phase difference in each symbol period, a frequency error of a locally generated frequency relative to a reception frequency of said received signal, said frequency error detecting device comprising means for sampling said received signal by a sampling signal at a sampling period into sampled vectors 2m in number in each burst, where m represents a predetermined integer, means for calculating zeroth through (2m−2)-th phase errors, each phase error accompanying a phase difference between two adjacent ones of said sampled vectors, means for calculating a dividend by using said zeroth through said (2m−2)-th phase errors, and means for dividing said dividend by a divisor comprising said sampling period, wherein said dividend calculating means comprises:

means for calculating zeroth through (2m−2)-th averages, each average as regards m consecutive ones of said zeroth through said (2m−2)-th phase errors starting at a q-th phase error of said zeroth through said (2m−2)-th phase errors with q varied between zero and (m−1), both inclusive; and means for calculating as said dividend a mean value of said zeroth through said (m−1)-th averages.

8. A frequency error detecting device as claimed in claim 7, wherein said predetermined integer is not less than fifteen.

9. A frequency error detecting device as claimed in claim 7, wherein said digital angle modulation is Gaussian filter minimum shift keying modulation.

10. A frequency error detecting device as claimed in claim 9, wherein said predetermined integer is not less than fifteen.

11. A frequency error detecting device as claimed in claim 7, wherein said digital angle modulation is minimum phase shift keying modulation.

12. A frequency error detecting device as claimed in claim 11, wherein said predetermined integer is not less than fifteen.

13. A quadrature demodulating device for demodulating a received signal derived from a transmitted signal subjected to digital angle modulation by a symbol sequence to have a constant phase difference in each symbol period with a frequency error of a locally generated frequency relative to a reception frequency of said received signal detected by a frequency error detecting arrangement comprising means for sampling said received signal by a sampling signal at a sampling period into sampled vectors 2m in number in each burst, where m represents a predetermined integer, means for calculating zeroth through (2m−2)-th phase errors, each phase error accompanying a phase difference between two adjacent ones of said sampled vectors, means for calculating a dividend by using said zeroth through said (2m−2)-th phase errors, and means for dividing said dividend by a divisor comprising said sampling period, wherein said dividend calculating means comprises:

means for calculating zeroth through (m−1)-th averages, each average as regards m consecutive ones of said zeroth through said (2m−2)-th phase errors starting at a q-th phase error of said zeroth through said (2m−2)-th phase errors with q varied between zero and (m−1), both inclusive; and means for calculating as said dividend a mean value of said zeroth through said (m−1)-th averages.

14. A quadrature modulating device as claimed in claim 13, wherein said predetermined integer is not less than fifteen.

15. A quadrature demodulating device as claimed in claim 13, wherein said digital angle modulation is Gaussian filter minimum shift keying modulation.

16. A quadrature demodulating device as claimed in claim 15, wherein said predetermined integer is not less than fifteen.

17. A quadrature demodulating device as claimed in claim 13, wherein said digital angle modulation is minimum phase shift keying modulation.

18. A quadrature demodulating device as claimed in claim 17, wherein said predetermined integer is not less than fifteen.

* * * * *

UNITED STATES PATENT AND TRADEMARK OFFICE
CERTIFICATE OF CORRECTION

PATENT NO. : 5,535,249
DATED : July 9, 1996
INVENTOR(S) : Toshikazu Miyashita

It is certified that error appears in the above-indentified patent and that said Letters Patent is hereby corrected as shown below:

Column 4, line 53, delete "(b 1)" and insert --(1)--.

Signed and Sealed this

Fifth Day of November, 1996

Attest:

BRUCE LEHMAN

*Attesting Officer*        *Commissioner of Patents and Trademarks*